(12) United States Patent
Kowles et al.

(10) Patent No.: US 10,580,468 B2
(45) Date of Patent: Mar. 3, 2020

(54) CACHE ACCESS TIME MITIGATION

(71) Applicant: Seagate Technology LLC, Cupertino, CA (US)

(72) Inventors: Andrew Michael Kowles, Lyons, CO (US); Mark Gaertner, Vadnais Heights, MN (US); Xiong Liu, Singapore (SG); WenXiang Xie, Singapore (SG); Kai Yang, Singapore (SG); Jiangnan Lin, Singapore (SG)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 60 days.

(21) Appl. No.: 15/720,115

(22) Filed: Sep. 29, 2017

(65) Prior Publication Data

US 2019/0103146 A1  Apr. 4, 2019

(51) Int. Cl.
*G06F 12/00* (2006.01)
*G11C 7/22* (2006.01)
*G11B 5/31* (2006.01)
*G11C 11/409* (2006.01)
*G06F 12/0871* (2016.01)
*G02B 3/10* (2006.01)

(52) U.S. Cl.
CPC .............. *G11C 7/222* (2013.01); *G02B 3/10* (2013.01); *G06F 12/0871* (2013.01); *G11B 5/31* (2013.01); *G11C 11/409* (2013.01)

(58) Field of Classification Search
CPC ......... G11C 7/222; G11C 11/409; G02B 3/10; G06F 12/0871; G11B 5/31
See application file for complete search history.

(56) References Cited

U.S. PATENT DOCUMENTS

| | | | |
|---|---|---|---|
| 4,636,886 A | 1/1987 | Schwarz | |
| 5,583,712 A | 12/1996 | Brunelle | |
| 6,012,126 A * | 1/2000 | Aggarwal | G06F 12/0866 709/203 |
| 6,389,510 B1 * | 5/2002 | Chen | G06F 16/9574 711/113 |
| 6,418,510 B1 | 7/2002 | Lamberts | |
| 7,012,771 B1 | 3/2006 | Asgari et al. | |
| 2003/0202270 A1 * | 10/2003 | Ng | G11B 5/012 360/51 |
| 2004/0019745 A1 * | 1/2004 | Espeseth | G06F 3/0613 711/137 |
| 2004/0205092 A1 * | 10/2004 | Longo | G06F 3/0613 |
| 2005/0198062 A1 * | 9/2005 | Shapiro | G06F 16/2282 |
| 2005/0270678 A1 * | 12/2005 | Uchida | G11B 5/40 360/63 |
| 2007/0236820 A1 * | 10/2007 | Lengsfield, III | B82Y 10/00 360/75 |

(Continued)

FOREIGN PATENT DOCUMENTS

EP  0757310 A2 *  2/1997  ........... G06F 3/0601

*Primary Examiner* — Prasith Thammavong
(74) *Attorney, Agent, or Firm* — Holzer Patel Drennan

(57) ABSTRACT

In accordance with one implementation, a method for reducing cache service time includes determining an access time parameter associated with movement of a read/write head to an access location for each of a plurality of contiguous cache storage segments and dynamically selecting one of the plurality of contiguous cache storage segments to store data based on the determined access time parameter.

20 Claims, 4 Drawing Sheets

Storage Device 100

| 118 | | | |
|---|---|---|---|
| Available Cache Regions | Seek Time | Rotational Latency | Total Access Time |
| Cache Region C | 12.5 ms | 5.5 ms | 18 ms |
| Cache Region D | 9.5 ms | 5.3 ms | 14.8 ms |
| Cache Region E | 14.0 ms | 5.7 ms | 19.7 ms |

(56) References Cited

U.S. PATENT DOCUMENTS

| | | | |
|---|---|---|---|
| 2012/0089579 A1* | 4/2012 | Ranade | G06F 16/1744 |
| | | | 707/693 |
| 2012/0089775 A1* | 4/2012 | Ranade | H03M 7/3091 |
| | | | 711/113 |
| 2012/0300336 A1* | 11/2012 | Benhase | G11B 5/012 |
| | | | 360/70 |
| 2016/0148643 A1 | 5/2016 | Gao et al. | |
| 2017/0235485 A1* | 8/2017 | Davis | G06F 3/061 |
| | | | 711/113 |

* cited by examiner

CACHE ACCESS TIME MITIGATION

BACKGROUND

Read and write caches are commonly used to temporarily store select data for fast access. Cache service time is affected by a number of factors including, for example, a type of storage media used for the cache, cache location within a storage media, data storage density (e.g., tracks-per-inch, bits-per-inch), as well as read and write speeds that can be realized in transferring data to and from the cache. Although disk cache storage is typically less expensive to implement than solid state cache storage, access to a disk cache may be slower than a solid state cache as a result of delays attributable to moving system components, such as the time for an actuator arm to seek to a target cache data track and rotational latencies incurred while the system "waits" for a target data sector to rotate under a read/write head after a seek has completed. Minimization of cache service time is particularly important in data storage systems that read and write large of amounts of cache data.

SUMMARY

A method disclosed herein reduces cache service time by dynamically selecting cache locations for data storage based on access time associated with each cache location. According to one implementation, the method entails determining an access time parameter associated with movement of a read/write head to a position to access (e.g., read or write) to each of a plurality of contiguous cache storage segments and dynamically selecting one of the plurality of contiguous cache storage segments to store data based on the determined access time parameter.

This Summary is provided to introduce an election of concepts in a simplified form that are further described below in the Detailed Description. This Summary is not intended to identify key features or essential features of the claimed subject matter, nor is it intended to be used to limit the scope of the claimed subject matter. Other features, details, utilities, and advantages of the claimed subject matter will be apparent from the following more particular written Detailed Description of various implementations and implementations as further illustrated in the accompanying drawings and defined in the appended claims.

DETAILED DESCRIPTION

Figure 1:
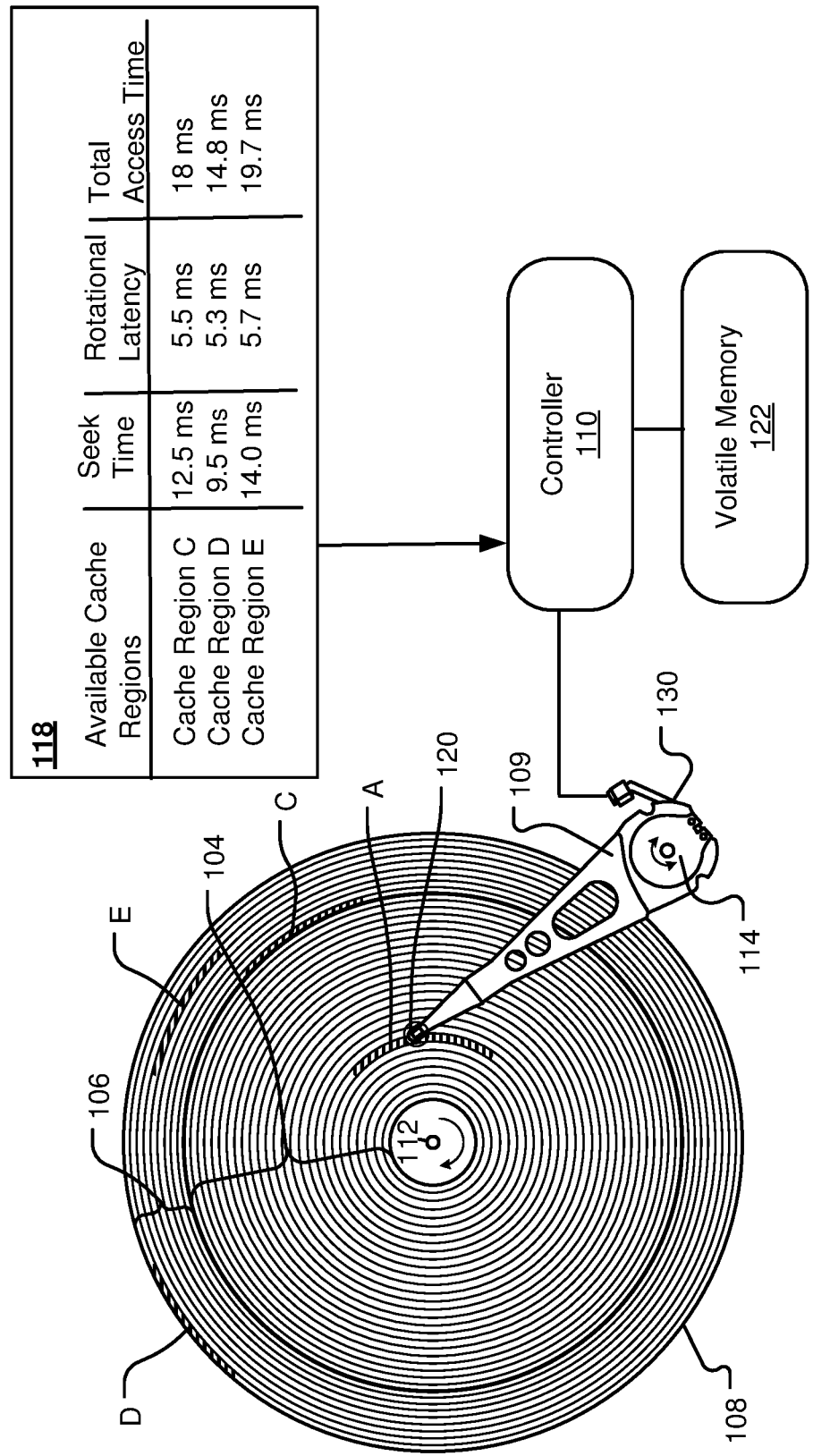
FIG. 1 illustrates an example storage device for implementing writes to a cache based on a dynamic assessment of access time associated with different available cache storage locations.

FIG. 1 illustrates an example storage device 100 for implementing writes to a cache based on a dynamic assessment of access time associated with different available cache storage locations. The example storage device 100 is a hard drive assembly including at least one storage media 108 and a transducer head 120 (also referred to herein as a read/write head) positioned at an end of an actuator arm 109 configured to rotate to position the transducer head 120 for reading data from or writing data to underlying data tracks on the storage media 108.

Although the storage media 108 is shown to be a magnetic disc, the storage media 108 may, in other implementations, include one or more storage media of a variety of other types of non-volatile memory including, for example, solid state drives, flash memory, optical storage discs, etc. While FIG. 1 shows a single storage media 108, other number of media (e.g., two discs, four discs, dix discs, etc.) can alternatively be included within the storage device 100.

During operation of the storage device 100, the transducer head 120 flies in close proximity above the surface of the storage media 108 while the media 108 is rotated by a spindle motor that rotates about an axis of rotation 112. A rotary voice coil motor that rotates about an actuator axis of rotation 114 is typically used to position while one or more transducers (e.g., read or write elements) of the transducer head 120 read data from and write data to the target data track. A flex cable 130 provides electrical connection paths between the transducer head 120 and a controller 110 while allowing pivotal movement of the actuator arm 109 during operation.

The storage media 108 includes a primary user data storage area referred to herein as a main store 104 and also includes a cache 106. The controller 110 manages a mapping of physical data blocks within the main store 104 to a logical block address (LBA) space utilized by a host device when reading user data from and writing user data to the storage media 108. The controller 110 also manages a dynamic mapping of physical data blocks in the cache 106 to LBAs of the host LBA scheme for the LBAs that are, at any given time, stored in the cache 106 and a location in the main store 104.

In FIG. 1, the main store 104 and the cache 106 are shown to occupy different contiguous storage areas on a same surface of the storage media 108. In other implementations, the main store 104 and/or the cache 106 are included on different media surfaces, different media, and/or individually distributed across different contiguous storage areas. For example, the storage device 100 may include more than one transducer head 120, actuator arm 109, and/or storage media 108 with user data storage areas and/or cache storage areas located on or distributed among the different media and/or different surfaces of the different media. In some devices, the storage device 100 includes a hybrid storage device with both disc and solid state storage.

The cache 106 includes at least one contiguous storage area and may include multiple contiguous storage areas. As used herein, "contiguous storage" refers to a storage area with multiple data blocks that can be written in sequence without radial movement of an actuator arm other than to allow normal track switches (e.g., radial movement) between adjacent data tracks. Although the cache 106 may be located at a variety of suitable locations, the cache 106 is shown to include several adjacent data tracks located near an outer diameter of the storage media 108. In general, data stored near the outer diameter of a magnetic disk can be read with a faster linear speed than data stored near the inner diameter. Consequently, cache service time may be improved by including the cache 106 at or near the outer diameter, as shown.

In different implementations, the cache 106 may serve different purposes such as to store frequently read data for quick read access, frequently updated data for quick write access, and/or to act as a "scratch pad." The term "scratch pad" generally refers to a cache region that is utilized to store new data and/or complement data, such as data pertaining to execution of a write operation. As used herein, "complement data" refers to unchanged data that is re-written during execution of a write operation that modifies one or more data cells on a storage media. Certain types of storage systems read and write large amounts of complement data whenever one or more data cells are updated. For example, shingled magnetic recording (SMR) systems and interlaced magnetic recording (IMR) systems typically read and re-write a grouping data tracks whenever one or more data cells within the grouping are changed. In these systems, an update to a data track may entail multiple steps including: reading multiple adjacent data tracks (e.g. a data band) into a cache scratch pad (e.g., a region within the cache 106), modifying one or more of the read data cells in volatile memory 122 (e.g., RAM, DRAM), and re-writing the read data back to the storage media 108 with one or more changed cells. The scratch pad is typically stored on non-volatile media to facilitate restoration of corresponding data in the main store 104 that may become corrupted if a power failure occurs during an update to such data. In some implementations of the disclosed technology, the cache 106 does not include a scratch pad.

To mitigate cache service time, the controller 110 is configured to dynamically select a cache storage location for servicing each individual write to the cache 106. Cache service time is a combination of cache access time and data transfer time. Together, the cache service time and cache access represent a total time duration for execution of a cache access operation, such as a total time for writing data to a cache or reading data from a cache. Cache access time refers to a cache read/write delay incurred while the storage system readies itself to access (e.g., read or write) data at a cache location. Transfer time, in contrast, refers to delay incurred while requested data is read from or written to the storage media 108.

The controller 110 implements various techniques for mitigating cache service time, primarily by reducing access time delays. According to one implementation, access time is reduced by selecting cache storage locations based on a dynamic assessment of access time associated with different available cache storage locations.

When the controller 110 initiates a command to write data to the cache 106, the controller 110 identifies a plurality of available contiguous regions within the cache 106 large enough to store the new cache data contiguously, such as along a single data track or within a group of adjacent data tracks. For each identified cache location, the controller evaluates one or more access time parameters, such as seek time, settle time, and/or rotational latency. For example, such access time parameters may be associated with movement of a read/write head to a position to access the identified cache location.

Seek time includes time for the actuator arm 109 to reposition itself from one radial position (e.g., a current position) to another that is within a predetermined distance of a destination track, such as a distance of one full track width from a destination track. Seek times can have variability due to a variety of factors but may in one implementation be approximately 11 ms for a read operation and 13 ms for a write operation.

Settle time is another delay that may be considered in isolation or as a component of seek time. After positioning the actuator arm within a predetermined distance from the destination track, the servo system transitions to a settling mode wherein the transducer head is "settled" on to the destination track. In one implementation, the settle mode following a seek entails a rotation of approximately 25 servo wedges below the transducer head 120, which may, for example, provide a position error signal within 8% of the track pitch. The term "seek-and-settle" time is used herein to refer to the combination of seek time and settle time.

Rotational latency, in contrast, refers to a time delay following the seek-and-settle of the transducer head 120 during which time the transducer head 120 "waits" for the storage media 108 to rotate to position a target sector beneath the transducer head 120. As used herein, actions described as occurring "following the seek operation" or "upon termination of a seek operation" generally refer to actions occurring after the seek-and-settle of the transducer head 120.

In FIG. 1, the controller 110 is configured to dynamically assess seek time and/or rotational latency to select a target cache location to receive data. In other implementations, the controller 110 is configured to assess additional access time parameters in lieu of or in addition to seek time and rotational latency, such as the probability of a seek arriving late (e.g., accounting for seek time variability) as well as the probability of fault.

In various implementations, access time parameters can be dynamically determined (e.g., calculated or looked-up from a table), or in some cases relationally inferred based on known spatial relationships between different storage locations. FIG. 1 illustrates a table 118 including exemplary information that may be determined the controller 110 when assessing available cache locations to execute a cache write, such as when copying data from to the cache 106 from the user data region A. Among other information, the table 118 includes a listing of identified available cache storage regions (e.g., available cache storage regions C, E, and H). For example, cache storage regions C, D, and E are identified as "available" because they each individually include contiguous storage space of a size that is commensurate with or greater than the size of data stored in the user data region A in the main store 104. Although the available cache storage regions C, D, and E are illustrated as partial tracks within the cache 106 (e.g., a few data sectors), the available cache storage regions C, D, and E may, in some implementations, represent full data tracks or bands of multiple adjacent data tracks.

To determine whether to transfer the data of user data region A of the main store 104 to the available cache storage region C, D, or E, the controller 110 evaluates one or more access time parameters associated with each region. Exemplary access time parameters shown in the table 118 include seek time, rotational latency, and total access time. In some implementations, the controller 110 selects a cache based on less than all of the information shown in the table 118 and/or by using other information in addition to or in lieu of that shown.

Each access time parameter is determined based on a known position of the transducer head 120 (e.g., a current or future position), which is describable by a radial position as well as a media position (e.g., sector index) that is currently positioned below the transducer head 120. In FIG. 1, the seek time parameter quantifies an estimated time for movement of the transducer head 120 from the current head position to an initial access position for a corresponding available cache storage region C, D, or E. The "access position" is, for example, a starting address of the corresponding available cache storage region C, D, or E. In contrast to seek time, the rotational latency parameter represents an amount of time, following the radial movement (the seek) of the transducer head 120, for rotation of the storage media 108 to position a start address of a target cache region (e.g., available cache region C, D, or E below the transducer head 120. In one implementation, the "total access time" represents a sum of these parameters.

In different implementations, the controller 110 may access different information to determine and assess seek time parameters. In some implementation, the controller 110 accesses a table to retrieve the "total access time" parameter without retrieving the seek time and rotational parameters individually. In still other implementations, the controller 110 determines or infers relative seek times for each of the identified available cache regions C, D, and E without retrieving or computing information pertaining to rotational latency. In other implementations, access time parameters are computed with formulas or by interpolating values stored in different tables.

Using one or more of the determined access time parameters, the controller 110 selects one of the available cache locations C, D, or E to receive a copy of the data from the user data region A. For example, the controller 110 may select the cache location C because it is associated with the lowest seek time and/or the lowest estimated total access time (e.g., based on estimates of both seek time and rotational latency).

In one implementation, the controller 110 selects a data track within the cache 106 for receiving data based on a determined seek time and writes data to the selected cache data track by implementing additional techniques that enable a zero-latency write. As used herein, the term "zero latency write" refers to a write operation initiated after a seek operation executable with substantially zero rotational latency between termination of the seek operation and the start of the immediately subsequent data write. "Substantially zero rotational latency" refers to, for example, rotational latency representing a degree of rotation of the storage media 108 relative to the transducer head 120 that is less than one cache data sector (e.g., a partial sector rotation). For example, the transducer head 120 may "land" on a position that is mid-way through a cache data sector at the termination of the seek but await alignment with the first available data bit in an immediately-proceeding data sector to begin writing data. In other implementations, there exists a slight time lag due for the head to recognize its position within the cache or to begin initiating a data transfer to the new position. These types of latencies are considered "substantially zero latency" because rotation of the media during such latency is minimal (e.g., less than about 1 sector of rotation). Example zero-latency write techniques are described in detail with respect to at least FIGS. 2 and 3 of the present application.

The controller 110 is shown within the storage device 100; however, some implementations may incorporate aspects of the controller 110 in hardware and/or software external to the storage device 100. Computer-executable instructions of the controller may be stored on any computer-readable storage media that is a tangible article of manufacture. Tangible computer-readable storage media includes, but is not limited to, RAM, ROM, EEPROM, flash memory or other memory technology, CDROM, digital versatile disks (DVD) or other optical disk storage, magnetic cassettes, magnetic tape, magnetic disk storage or other magnetic storage devices, or any other tangible medium which can be used to store the desired information and which can be accessed by mobile device or computer. In contrast to tangible computer-readable storage media, intangible computer-readable communication signals may embody computer readable instructions, data structures, program modules or other data resident in a modulated data signal, such as a carrier wave or other signal transport mechanism.

Figure 2:
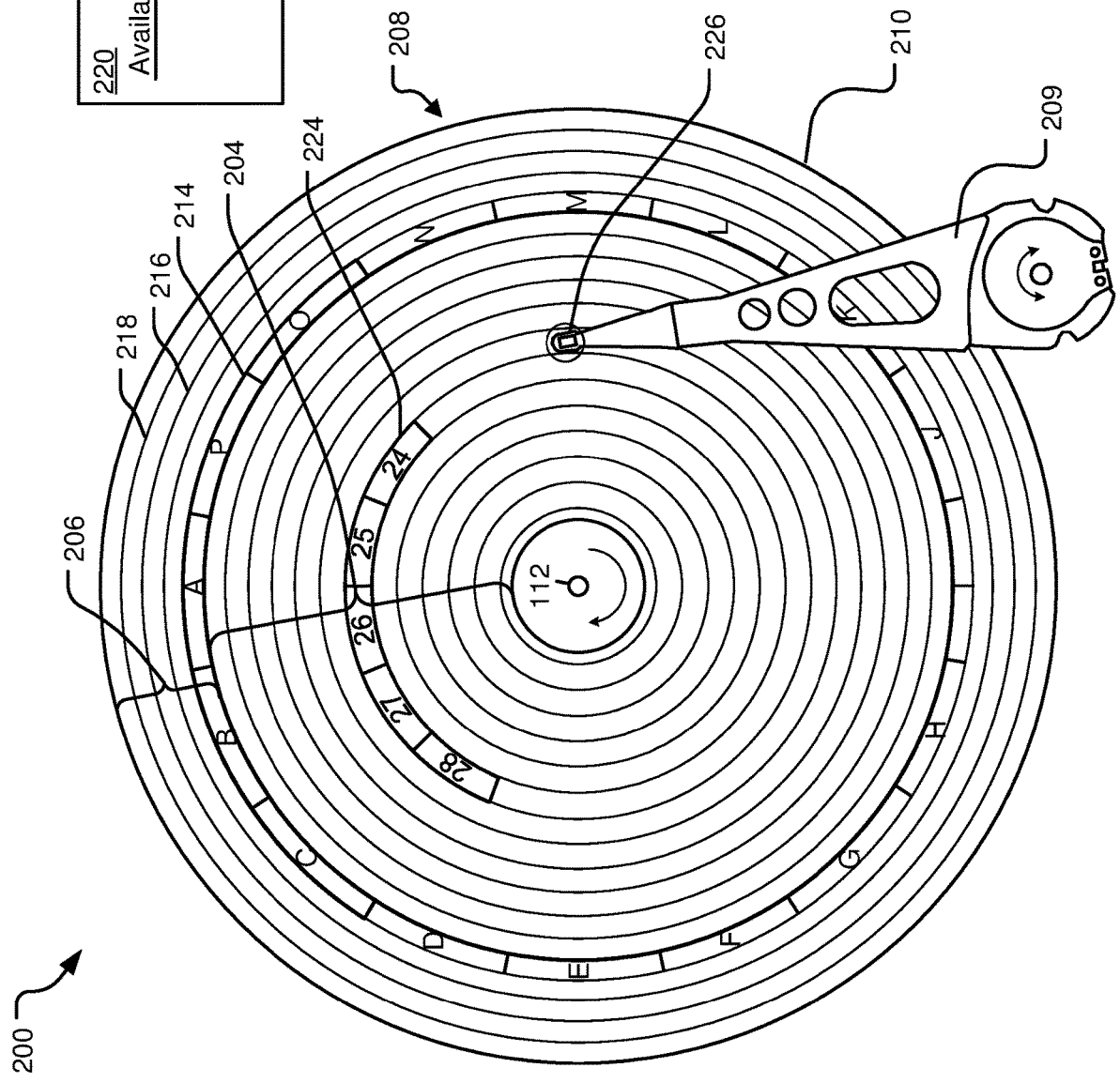
FIG. 2 illustrates an example system for implementing a cache write based on a dynamic assessment of access time.

FIG. 2 illustrates an example system 200 for implementing a cache write based on a dynamic assessment of access time. The system includes at least one storage media 208 including a main store 204 for storing user data according to a host LBA scheme and a cache 206. The cache 206 is shown as including a contiguous grouping of data tracks near an outer diameter 210 of the storage media 208. In other implementations, the cache 206 may be located differently and/or distributed across multiple different non-contiguous regions of the storage media 208, multiple media, and/or multiple media surfaces.

In the example of FIG. 2, a controller (not shown) of the storage system 200 executes a cache write of data initially read from a main store data segment 224. Notably, other writes to the cache 206 may include data that is not first read from the main store 204. For example, incoming cache data may be transferred into memory from a host or another type of storage media and subsequently be written to the cache 206.

In FIG. 2, the example cache write entails reading data from the main store data segment 224, identifying one or more regions in the cache 206 available to receive the read data, selecting a target region from the identified regions in the cache 206 that can be accessed with a shortest seek time, and writing the data to the selected target region according to a zero-latency write methodology.

To begin the process for selecting a target region in the cache 206 to receive data of the main store data segment 224, the controller initially identifies a number of cache storage regions available to receive the data. In one implementation, the controller identifies a cache region as "available" if it includes contiguously writable storage space large enough to store all of the incoming cache data (e.g., the data from the main store data segment 224). Although the controller may, in some implementations, identify "partial tracks" as available cache regions (e.g., as in FIG. 1), the controller of the exemplary storage system 200 identifies full data tracks as either available (e.g., empty or including stale data) or not available to receive data of the cache write. To exemplify this, FIG. 2 includes a table 220 illustrating exemplary information that may be determined (e.g., computed, looked-up, or inferred to suitable approximation) by the controller. The table 220 indicates that each of three data tracks 214, 216, and 218 is currently empty or includes stale (invalid) data.

In addition to identifying the available cache data regions for the cache write (e.g., the cache data tracks 214, 216, and 218), the controller also determines which of the available cache data regions can be accessed with a shortest "seek" (e.g., often, the least amount of movement) of the transducer head 226. For illustrative purposes, the table 220 includes a seek time in association with each of the identified available cache data tracks 214, 216, and 218. The seek time quantifies the time interval for moving the transducer head 226 from a current radial position over the main store data segment 224 to a radial position for accessing one of the available cache data tracks 214, 216, and 218. In various implementations, the seek time for accessing each of the cache data tracks 214, 216, and 218 is dynamically computed, retrieved, or inferred. For example, the controller may infer relative seek times for each of the identified available cache data tracks 214, 216, and 218 based on a track numbering scheme (e.g., inferring that the data track 214 is associated with a smallest seek time since it has a track number that is closest to the track including the main store data segment 224 that is currently being accessed by a transducer head 226).

Responsive to determining that the cache data track 214 can be accessed with a shorter seek time than the other identified available cache regions, the controller rotates an actuator arm 209 to move the transducer head 226 from its current position to a position radially aligned with the cache data track 214. The controller then performs a dynamic mapping of host LBAs to cache sectors (e.g., exemplary cache sectors denoted A-P). This mapping and write operation are performed in a manner that effectuates a zero-latency write.

In some storage systems that do not facilitate zero-latency cache writes, incoming cache data is initially mapped to a cache region without regard for a location where the transducer head 226 "lands" following a seek to a target cache data track (e.g., the cache data track 214). For example, host LBAs 24-28 of the main store 204 are mapped to cache data sectors A-E and data of the LBA sequence is written according to the strict LBA order (e.g., 24, 25, 26, 27, 28) in the cache 206. Following a seek to the cache data track 214, the transducer head 226 "waits" for a time after the seek to the cache is completed to allow for the first sector in the mapped sequence (e.g., sector A) to rotate under the transducer head 226. This small latency due to rotation of the storage media 208 can have a significant cumulative impact, particularly in systems that read and write large amounts of data to the cache 206.

In contrast, the controller of the storage system 200 implements a zero-latency cache write by performing a dynamic LBA-to-cache mapping that is based on the location where the transducer head "lands" at the termination of the seek to the target cache data track. After rotating the actuator arm 209 to position the transducer head 226 in position to access the selected cache data track (e.g., the data track 214), the controller instructs the transducer head 226 to begin writing the read data from the main store data segment 224 without waiting for a particular target sector of the cache data track 214 to rotate under the transducer head 226.

The controller dynamically maps a first LBA (e.g., LBA 24) of the of the main store data segment 224 to the first sector in the selected data track 214 that the transducer head 226 identifies following the termination of the seek operation. If, for example, sector O is the first sector from which the transducer head 226 is able to read header information following the seek to the cache data track 214, sector O is dynamically mapped to LBA 24, and the remaining LBAs of the main store data segment 224 are mapped, in consecutive LBA order, to the sequence of contiguous sectors on the cache data track 214 consecutively accessed as the storage media 208 rotates below the transducer head (e.g., LBAs 25, 26, 27, and 28 are mapped to cache sectors O, P, A, B, and C respectively). An example mapping table 222 exemplifies this scenario. As a result of the above-described cache write methodology, seek delays are mitigated and rotational latency is effectively eliminated.

Although the "Available Cache Regions" of FIG. 2 are shown to be full data tracks, the controller may, in some implementations, identify available regions that are partial tracks. In this case, the controller may map the first LBA of the cache write to the first cache sector that the transducer head 226 is able to identify as part of the target "available region" following the seek operation. Additionally, it should be understood that certain storage systems may implement the above-described technology to copy full data tracks from the main store 204 to the cache 206 rather than partial tracks as in the illustrated example.

Figure 3:
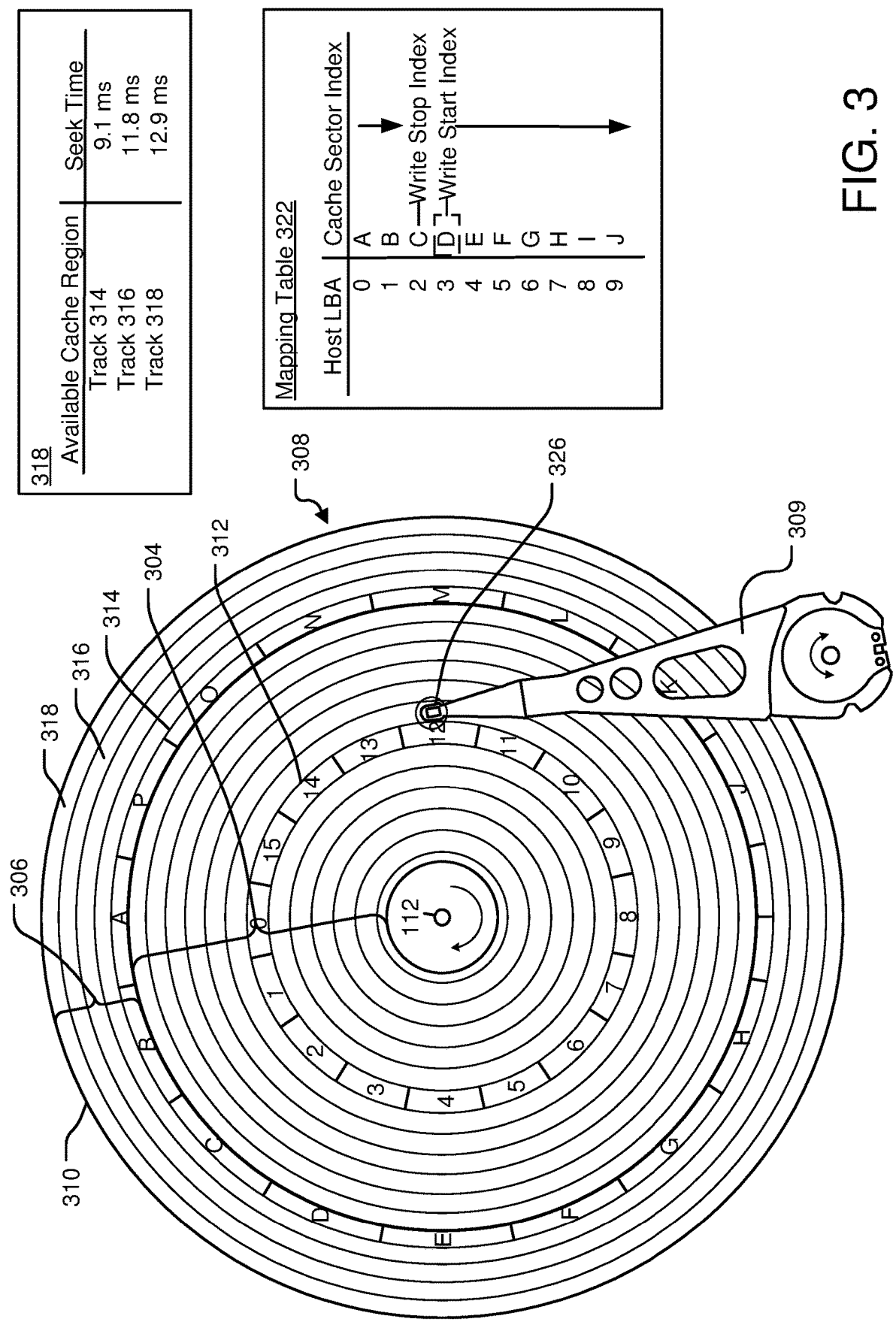
FIG. 3 illustrates another example system for implementing a cache write based on a dynamic assessment of access time.

FIG. 3 illustrates another example system 300 for implementing a cache write based on a dynamic assessment of access time. The system includes at least one storage media 308 including a main store 304 for storing user data and a cache 306. As in other examples, the cache 306 is shown as including a contiguous grouping of data tracks near an outer diameter 310 of the storage media 308 but may, in other implementations, be located differently and/or distributed across multiple different non-contiguous regions of the storage media 308 or distributed across multiple media and/or media surfaces.

In an example of FIG. 3, a controller (not shown) of the storage device 300 executes a cache write that entails reading the data from a data track 312 of the main store 304, identifying one or more regions (e.g., tracks) in the cache 306 available to receive the data, selecting a target region from the identified regions in the cache 306 that can be accessed with a shortest seek time, and writing the data to the selected target region according to a zero-latency write methodology somewhat different than the zero-latency methodology discussed above with respect to FIG. 2.

To select a target region in the cache 306 for receiving data of the data track 312, the controller initially identifies a number of available cache storage regions for potentially receiving the data. In one implementation, the controller identifies a region as "available" if it includes contiguously writable storage space large enough to store all of the data from the data track 312. Although the controller may, in some implementations, identify partial tracks as available cache regions, such as individual sectors or groupings of contiguous sectors as shown in FIG. 1, the controller of the storage device 300 is configured to determine which data tracks in the cache region are entirely available (e.g., empty or including stale data) to receive data of the cache write. To exemplify this, FIG. 3 includes a table 320 illustrating exemplary information accessible by the controller. The table 320 indicates that each of the data tracks 314, 316, and 318 is currently empty or storing invalid data.

In addition to identifying the available cache data regions for the cache write (e.g., the data tracks 314, 316, and 318), the controller also determines which of the available cache data regions can be accessed with a shorted seek time. For illustrative purposes, the table 320 includes a seek time in association with each of the identified data tracks 314, 316, and 318. In various implementations, the seek time for each of the data tracks 314, 316, and 318 may be dynamically computed, retrieved, or inferred, as described with respect to FIG. 2, above.

Responsive to a determination that the data track 314 can be accessed with a shorter seek time than the other identified available cache regions, the controller rotates an actuator arm 309 to move a transducer head 326 from its current position to a position radially-aligned with the data track 314. Subsequently, the controller begins writing data at the start at the first identified cache sector following the seek operation so as to effectuate a zero-latency write.

In contrast, the example provided above with respect to FIG. 2, the controller of FIG. 3 performs a mapping of host LBAs to cache sectors (e.g., cache sectors denoted A-P, for example) that allows the LBA sequence to be written out of order to facilitate the zero latency write. Rather than mapping the first LBA of the main store data segment 324 to the first identified cache data sector (e.g., as described with respect to FIG. 2), the controller performs a mapping that, in itself, is not based on the position that the transducer head 326 'lands' at the termination of the seek to the target cache data track. While the mapping of host LBAs to cache sectors is independent of transducer head position, the order in which the host LBAs are written depends on the transducer head position.

According to FIG. 3, the controller determines that the cache data track 314 is available to receive the read from the main store data track 312 and also determines that the cache data track 314 can be accessed with a shorter seek time than any other identified cache regions available to receive the data. The controller repositions the transducer head 326 over the cache data track 314, and begins writing the data, according to an imperfect LBA order, to the first identified cache data sector that passes under the transducer head 326 following the seek operation and settling of the transducer head onto a target data track. If, for example, the cache data sector "D" is the first sector that passes under the transducer head 326 following the seek operation, the controller uses a mapping table 322 to determine which host LBA has been pre-mapped to the cache data sector "D." In the illustrated example, LBA 3 is mapped to cache data sector D, so the controller begins writing the sequence at sector D, according to the order 3, 4, 5, 6, 7, 9. Following the last LBA of the host LBA sequence, the controller loops back to the beginning of the sequence (e.g., writing LBAs 0, 1, 2, 3) such that the data track 314 then stores LBAs, in order, 3, 4, 5, 6, 7, 8, 9, 0, 1, 2, 3 within sectors D, E, F, G, H, I, J, A, B, C, respectively. This technique of using a pre-determined mapping and starting a cache write somewhere in the middle of the LBA sequence results in a substantially zero-latency write operation.

Notably, the above-described write technique may be beneficial to implement when a full data track is being copied from the main store to an equally-sized data track in the cache, or when the size of data to be transferred to the cache approaches or exceeds the size of an individual data track. In these cases, data written to the cache can be written back randomly, in order, without latencies due to rotation through sectors that are not part of the sequence. For example, a sequence written in order 3, 4, 5, 6, 7, 8, 9, 0, 1, 2, 3 can be read back in the proper LBA order 0, 1, 2, 3, 4, 5, 6, 7, 8, 9. In other cases, such as when the cache 306 includes tracks of different size than tracks in the main store 304 or when a partial track is being copied to the cache 306, the technique can still result in a zero latency write but may introduce minor latencies apparent when the data is read back from the cache in a consecutive LBA order. If, for example, there are one or more empty sectors on either end of the written sequence, such as the host LBA sequence "3, 4, 5, 6, 7, 8, 9, 0, 1, 2, [empty sector], . . . "), then a consecutive readback of the LBA sequence reflects some latency due to the rotation of the empty sector(s) below the transducer head. In the above example, the transducer head 326 may read back from consecutive sectors the LBA sequence "0, 1, 2, [empty], . . . 3, 4, 5, 6, 7, 8, 9." Thus, some rotational latency is observed during the readback (e.g., between sectors including LBAs 2 and 3).

Figure 4:
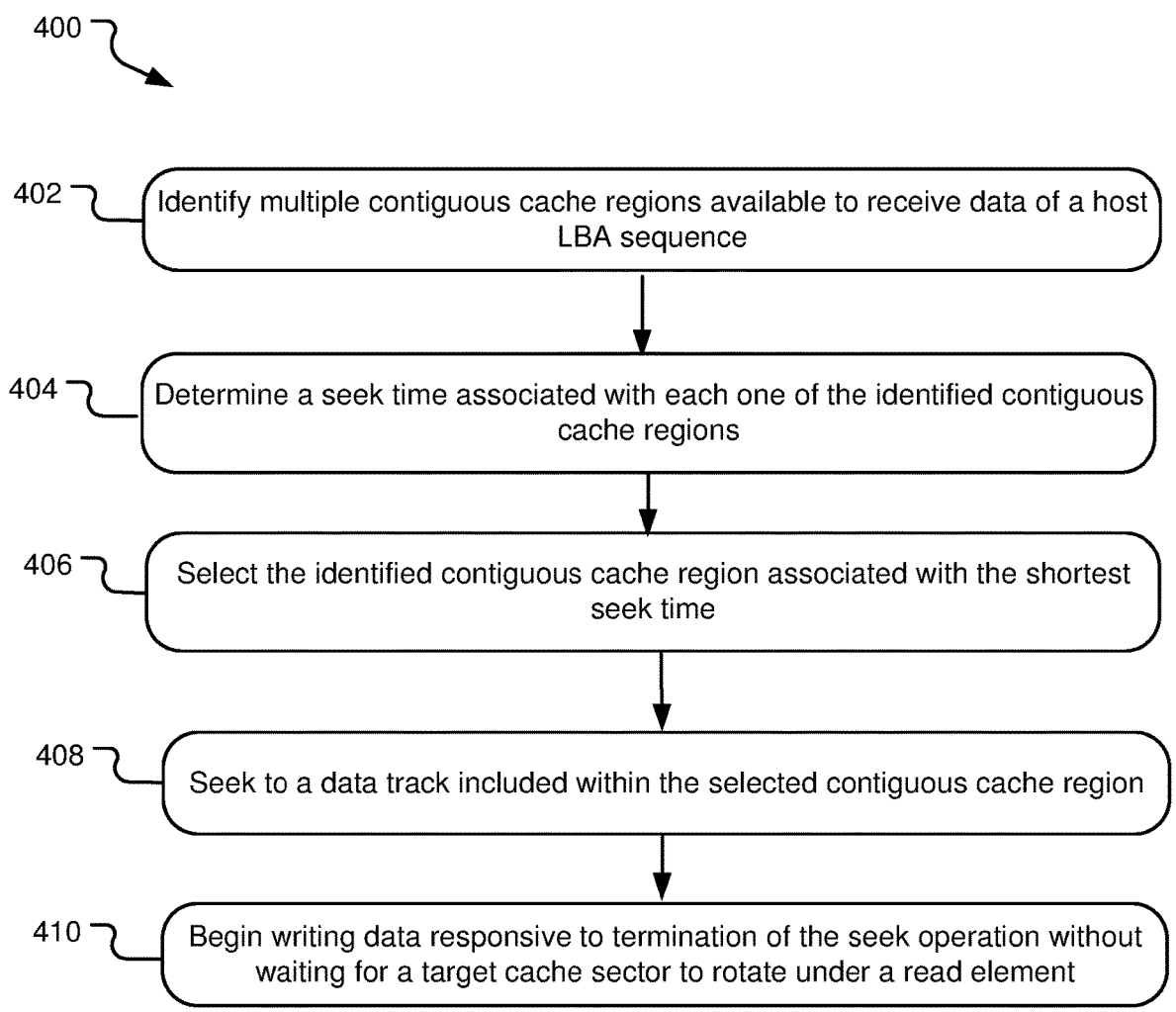
FIG. 4 illustrates example operations for implementing a cache write based on a dynamic assessment of access time.

FIG. 4 illustrates example operations 400 for implementing a cache write based on a dynamic assessment of access time. An identification operation 402 identifies multiple contiguous cache regions available to receive data of a host LBA sequence. A determination operation 404 determines a seek time associated with accessing a nearest data track included in each one of the identified contiguous regions. If, for example, an identified contiguous region includes three data tracks in the cache, the determination operation 404 determines a seek time for re-positioning a transducer head to access a closest one of the three data tracks. In one implementation, seek time is estimated based on a current position of the actuator arm. In another implementation, the seek time is based on an estimated position of the actuator arm after completing a pending or in-progress read command. If, for example, a band of consecutive tracks is to be moved to the cache, the determination operation 404 may compute an estimated seek time for moving a transducer head from a position of access to a last consecutively-read data track in the band at the end of the read operation within the main store to a position for accessing a first data track in each of the identified contiguous cache regions at the beginning of the cache write.

A selection operation 406 selects the available contiguous cache region that can be accessed according to a shortest seek time. A seeking operation 408 pivots an actuator arm to reposition a transducer head for access to a first track of the selected cache region. At the termination of the seek operation (e.g., as soon as the transducer head confirms a track ID following the seek), a write operation 410 executes to initiate substantially immediate writing of data to the cache without waiting for a target cache sector to rotate under the transducer head. For example, the write operation 410 begins writing data to the underlying data track responsive to identification of a first cache sector that passes under the transducer head following the seek operation, such as responsive to identification and confirmation of cache sector header information.

In different implementations, the write operation 410 can be effectuated by different mapping techniques. In one implementation, LBAs of the incoming cache data are mapped to the cache based on a position of the transducer head following the seek (e.g., as described above with respect to FIG. 2). For example, a first LBA in the sequence of incoming LBAs is mapped to the first cache sector that passes under the head following the seek operation. This dynamic mapping based on "landing head position" (e.g., a first recognized position after a seek operation) can be performed before, during, or after the seek. After mapping the first LBA in this manner, the remainder of the incoming LBA sequence is mapped in LBA order to the proceeding sequence of available cache sectors that consecutively pass under the transducer head. When effectuated by the above mapping and writing techniques, the write operation 410 results in a zero-latency write.

The implementations described herein are implemented as logical steps in one or more computer systems. The logical operations of the present invention are implemented (1) as a sequence of processor-implemented steps executing in one or more computer systems and (2) as interconnected machine or circuit modules within one or more computer systems. The implementation is a matter of choice, dependent on the performance requirements of the computer system implementing the invention. Accordingly, the logical operations making up the implementations of the invention described herein are referred to variously as operations, steps, objects, or modules. Furthermore, it should be understood that logical operations may be performed in any order, adding and omitting as desired, unless explicitly claimed otherwise or a specific order is inherently necessitated by the claim language.

The above specification, examples, and data provide a complete description of the structure and use of exemplary implementations of the invention. Since many implementations of the invention can be made without departing from the spirit and scope of the invention, the invention resides in the claims hereinafter appended.

What is claimed is:

1. A method comprising:
   determining an access time parameter associated with movement of a read/write head to a position to access each of a plurality of contiguous cache storage segments; and
   dynamically selecting one of the plurality of contiguous cache storage segments to store data based on the determined access time parameter; and
   initiating a cache write within a select sector index of the dynamically-selected contiguous cache storage segment, the select sector index being selected based on a position where the read/write head lands relative to an underlying data track upon termination of a seek operation that repositions the read/write head over the dynamically-selected contiguous cache storage segment.

2. The method of claim 1,
   wherein the access time parameter quantifies at least one of seek time and rotational latency following seek time.

3. The method of claim 1, wherein the access time parameter quantifies a seek time associated with accessing a data track including a cache location.

4. The method of claim 1, wherein the access time parameter quantifies a rotational latency associated with accessing a cache location, the rotational latency occurring subsequent to a seek to a data track including the cache location.

5. The method of claim 1, wherein the selected one of the contiguous cache storage segments resides in at least two non-contiguous regions of a cache.

6. The method of claim 1, further comprising:
   seeking the read/write head to a data track including the dynamically selected one of the contiguous cache storage segments; and
   initiating a cache write with substantially zero rotational latency upon termination of the seeking operation without waiting for a target cache block to rotate under the read/write head.

7. The method of claim 6, wherein execution of the cache write includes writing data of a consecutive sequence of host LBAs and the method further comprises:
   dynamically assigning a first LBA in the consecutive sequence of host LBAs to a storage block in the cache that is accessible by the read/write head upon termination of the seeking operation with substantially zero rotational latency.

8. The method of claim 6, wherein execution of the cache write includes writing data of a consecutive sequence of host LBAs to a contiguous sequence of cache storage blocks and the method further comprises:
   executing the cache write by writing a portion of data of the consecutive sequence of host LBAs according to a non-consecutive LBA order within the selected one of the contiguous cache storage segments to facilitate a zero-latency write.

9. A system comprising:
   a rotating storage media; and
   a controller configured to:
   determine an access time parameter associated with movement of a read/write head to a position to access each of a plurality of contiguous cache storage segments on the rotating storage media, and
   dynamically select one of the contiguous cache storage segments to receive data based on the determined access time parameter; and
   initiate a cache write within a select sector index of the dynamically-selected contiguous cache storage segment, the select sector index being selected based on a position where the read/write head lands relative to an underlying data track upon termination of a seek operation that repositions the read/write head over the dynamically-selected contiguous cache storage segment.

10. The system of claim 9, wherein the access time parameter quantifies at least one of seek time and rotational latency following seek time.

11. The system of claim 9, wherein the access time parameter quantifies a seek time associated with accessing a data track including a cache location.

12. The system of claim 9, wherein the access time parameter quantifies a seek time associated with accessing a data track including a cache location.

13. The system of claim 9, wherein the plurality of contiguous cache storage segments reside in at least two non-contiguous region of a cache.

14. The system of claim 9, wherein the controller is further configured to:
    execute a seek operation to move the read/write head to a data track including the dynamically selected one of the contiguous cache storage segments; and
    initiate a cache write responsive to completed execution of the seek operation without waiting for a target cache block to rotate under the read/write head.

15. The system of claim 14, wherein the controller is further configured to:
    execute the cache write by writing data of a consecutive sequence of host LBAs to consecutive data blocks in the dynamically selected one of the contiguous cache storage segments; and
    dynamically map a first LBA in the consecutive sequence of host LBAs to a cache storage block of the dynamically selected one of the contiguous cache segments that is accessible by the read/write head upon termination of the seek operation with substantially zero rotational latency.

16. The system of claim 14, wherein the controller is further configured to:
    map a consecutive sequence of host LBAs to consecutive data blocks in the dynamically selected one of the contiguous cache segments; and
    execute the cache write by writing some data of some logical blocks in the sequence of host LBAs according to a non-consecutive LBA order within the selected one of the contiguous cache segments to facilitate a zero-latency write.

17. One or more tangible computer-readable storage media encoding computer-executable instructions for executing on a computer system a computer process, the computer process comprising:
    determining an access time parameter associated with movement of a read/write head to a position to access each of a plurality of contiguous cache storage segments; and
    dynamically selecting one of the plurality of contiguous cache storage segments to store data based on the determined access time parameter; and
    initiate a cache write within a select sector index of the dynamically-selected contiguous cache storage segment, the select sector index being selected based on a position where the read/write head lands relative to an underlying data track upon termination of a seek operation that repositions the read/write head over the dynamically-selected contiguous cache storage segment.

18. The one or more tangible computer-readable storage media of claim 17, wherein the access time parameter quantifies a rotational latency associated with accessing a cache location, the rotational latency occurring subsequent to a seek to a data track including the cache location.

19. The one or more tangible computer-readable storage media of claim 17, further comprising:
   seeking the read/write head to a data track including the dynamically selected one of the contiguous cache storage segments; and
   initiating a cache write upon termination of the seeking operation without waiting for a target cache block to rotate under the read/write head.

20. The one or more tangible computer-readable storage media of claim 17, wherein the access time parameter quantifies at least one of seek time and rotational latency following seek time.

\* \* \* \* \*